(12) United States Patent
Husted et al.

(10) Patent No.: US 7,349,503 B2
(45) Date of Patent: Mar. 25, 2008

(54) ADAPTIVE INTERFERENCE IMMUNITY CONTROL

(75) Inventors: Paul J. Husted, San Jose, CA (US); Huanchun Ye, Cupertino, CA (US); Aman Singla, Fremont, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 817 days.

(21) Appl. No.: 10/704,359

(22) Filed: Nov. 7, 2003

(65) Prior Publication Data

US 2005/0100119 A1  May 12, 2005

(51) Int. Cl.
*H04B 1/10* (2006.01)
*H04L 1/00* (2006.01)

(52) U.S. Cl. .................. 375/346; 375/260
(58) Field of Classification Search ........... 375/346, 375/260, 361, 219, 220, 295, 261
See application file for complete search history.

(56) References Cited

U.S. PATENT DOCUMENTS

| | | | |
|---|---|---|---|
| 6,018,544 A | 1/2000 | Kotzin et al. | |
| 6,470,047 B1 * | 10/2002 | Kleinerman et al. | 375/232 |
| 6,603,825 B1 | 8/2003 | Pecen | |
| 6,687,319 B1 * | 2/2004 | Perino et al. | 375/367 |
| 6,748,200 B1 * | 6/2004 | Webster et al. | 455/234.1 |
| 2003/0053410 A1 * | 3/2003 | Williams et al. | 370/207 |
| 2004/0013168 A1 * | 1/2004 | Haines et al. | 375/132 |
| 2006/0056352 A1 * | 3/2006 | Proctor et al. | 370/332 |
| 2006/0078038 A1 * | 4/2006 | McCorkle | 375/130 |

FOREIGN PATENT DOCUMENTS

EP  1 225 736 A2  7/2002

\* cited by examiner

*Primary Examiner*—David B. Lugo
(74) *Attorney, Agent, or Firm*—Bever, Hoffman & Harms, LLP; Jeanette S. Harms (57) ABSTRACT

Wireless local area networks must work in less than ideal environments, including environments having externally and internally generated interfering RF signals. Interfering signals can cause significant problems with signal detecting, amplifier gain adjustment, and signal decoding. Various parameters of the WLAN receiver can be adjusted to mitigate the effects of interference. By selectively adjusting sets of these parameters, receiver sensitivity and interference immunity can be advantageously balanced. In one embodiment, adjustments to these parameter sets can be made in response to different sources of interference.

33 Claims, 5 Drawing Sheets

ADAPTIVE INTERFERENCE IMMUNITY CONTROL

BACKGROUND OF THE INVENTION

1. Field of the Invention

The present invention relates to wireless local area networks (WLANs) and in particular to various techniques that can dynamically adjust parameters relating to interference immunity, thereby improving receiver performance.

2. Discussion of the Related Art

Wireless local area networks (WLANs) are becoming increasingly popular as communication networks. The IEEE 802.11 standards provide guidelines for the operation of devices operating in WLANs. The environment in which these WLANs operate can include both external and internal sources of interfering signals.

Figure 1:
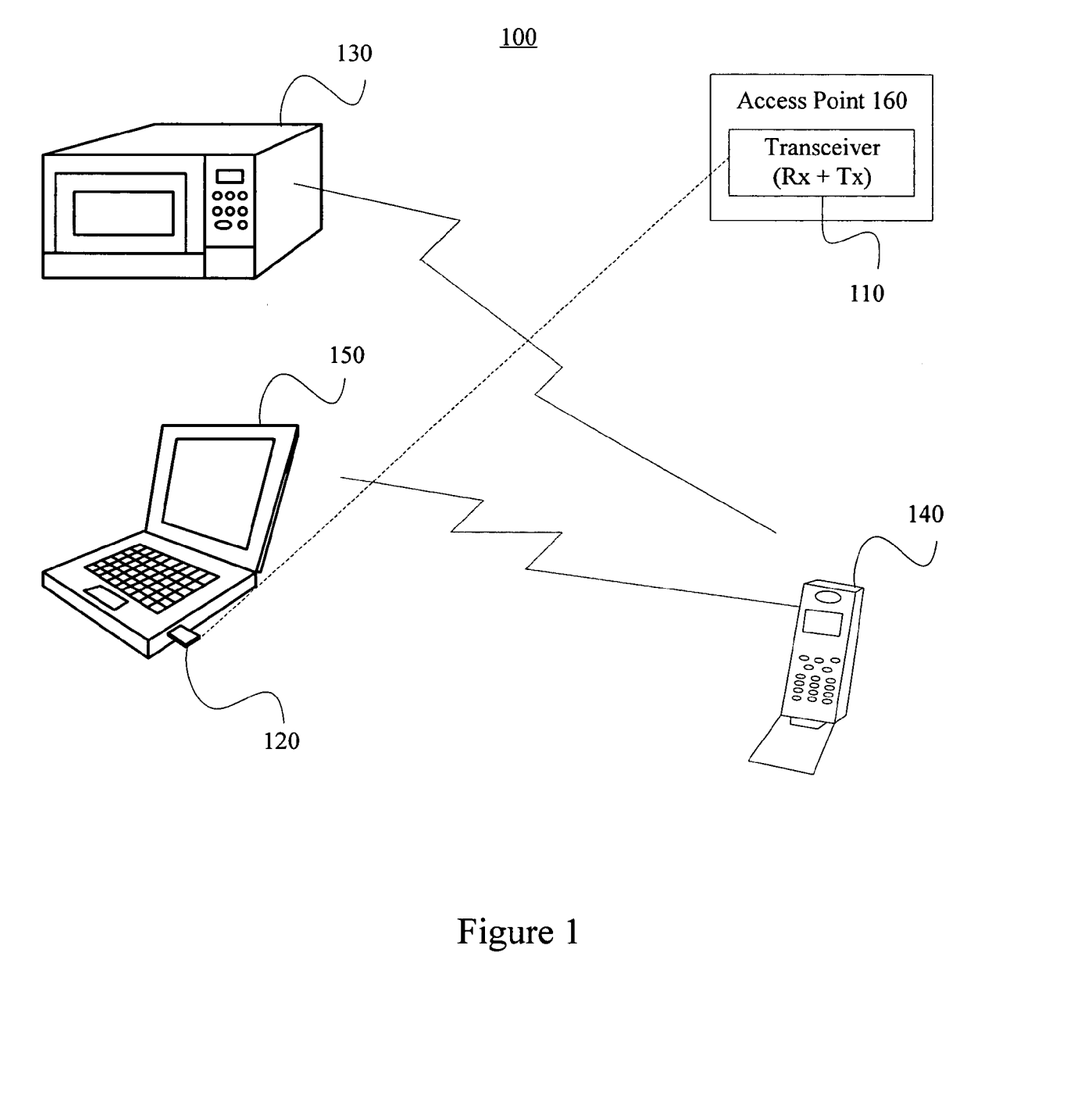
FIG. 1 illustrates an exemplary WLAN environment that includes both external and internal interference.

For example, FIG. 1 illustrates a pair of WLAN transceivers 110 and. 120 communicating in an RF environment 100. Transceivers include both receiver and transmitter components. In FIG. 1, WLAN transceiver 110 forms part of an access point 160 whereas WLAN transceiver 120 is attached to a laptop computer 150.

Two common external interference sources in RF environment 100, e.g. a microwave oven 130 and a wireless telephone 140, may unpredictably emit noise (shown as dotted lines) in RF environment 100. This external noise can undesirably degrade the performance of both WLAN transceivers 110 and 120.

Interference more closely associated with the WLAN transceivers, called internal interference, can also undesirably degrade performance. For example, laptop computer 150 may transmit predictable clock-related emissions. Specifically, CPU clocks in laptop computer 150 or harmonics of those clocks may have spread-spectrum characteristics. For example, the CDC960 clock generator, manufactured by Texas Instruments Incorporated of Dallas, Tex., generates a 200 MHz clock having spread-spectrum characteristics. In this clock generator, spectral spreading is accomplished by repeatedly sweeping a carrier frequency from a nominal value to a value as much as −0.5% of nominal. Unfortunately, spread spectrum clock interference (SSCI) at approximately the operating frequency of an IEEE-802.11a compliant device could sweep in and out of the passband of the WLAN receiver, thereby appearing to be a pulsing, wideband signal.

Additionally, both WLAN transceivers 120 and 130 can include RF processing circuits. These RF processing circuits can generate predictable spurious signals, called spurs, that vary based on channel, board design, and specific boards and/or components on those boards. Spurs are narrow spectral lines (i.e. tones) that can appear within the WLAN receiver passband. Techniques for processing data with spurs at the packet processing level are discussed in U.S. Patent application Ser. No. 10/664,792, entitled "Spur Mitigation Techniques", filed on Sept. 16, 2003 by Atheros Communications, Inc., and herein incorporated by reference.

Interfering signals may render WLAN transceivers 110 and 120 unable to receive packets. Even when WLAN transceivers 110 and 120 are able to receive packets, they may generate "false detects", i.e. erroneously characterizing an interfering signal as a valid data packet. After further analysis, WLAN transceivers 110 and 120 can correct their initial characterization and signal an error condition. Unfortunately, this false triggering decreases throughput because WLAN transceivers 110 and 120 may miss reception of a packet while processing a false detection. Moreover, false triggering can delay transmission while the mediums in WLAN transceivers 110 and 120 are falsely declared busy.

Currently, external interference can be mitigated by changing the physical environment of the WLAN, e.g. by repositioning or turning off microwave oven 130. In contrast, internal interference would typically require adjusting transceivers 110 and 120. One such adjustment is reducing the size of the signal at the ADCs to give more range, thereby reducing the number of false detects. To make this reduction, parameters associated with packet detection can be chosen based on empirical measurements. These parameters, called an interference immunity parameter set, are typically chosen based on a worst-case scenario. Note that this sensitivity reduction need not be dB for dB.

However, choosing an interference immunity parameter set for a worst-case scenario undesirably reduces the overall sensitivity of the receiver. Further, such a setting would not necessarily be optimized for each type of interference. That is, various interference signals have different characteristics that require different mitigation strategies.

Therefore, a need arises for an automated control system and method that enhances interference immunity in a WLAN transceiver.

SUMMARY OF THE INVENTION

In accordance with one aspect of the invention, various parameters can be automatically adjusted to mitigate the effects of interference on a WLAN receiver. In general, these interference immunity parameters can be adjusted based on measured false detect rates. Advantageously, an interference immunity parameter set can be selected to mitigate each interference type, thereby maximizing receiver functionality and performance.

In one embodiment, a table of interference immunity parameter sets can be generated. An interference immunity parameter set can be accessed by selecting an index of the table. Periodically, non-minimum values in at least one interference immunity parameter set can be reduced.

In one embodiment, the false detect rate can be measured by time-stamping a plurality of false detect events including at least a first false detect event and a last false detect event. At this point, a fixed number of the plurality of false detect events can be counted. Then, a ratio of that fixed number and the difference between the last false detect event time stamp and the first false detect event time stamp can be calculated.

An adaptive interference reducer in a WLAN receiver is also provided. The adaptive interference reducer can include a false detect block for generating a false detect rate value, a power measurement block for selecting a set of spread spectrum clock interference (SSCI) immunity parameters based on the false detect rate value, and a modulation identifier for adjusting a non-SSCI immunity parameter based on the false detect rate value.

The SSCI immunity parameters can be provided in an indexed table. The SSCI immunity parameters can include a coarse_high parameter relating to a high power threshold of a signal received by the WLAN receiver and a coarse_low parameter relating to a low power threshold of that received signal. The immunity parameter other than SSCI can include a bb_cycpwr_thr1 threshold relating to weak OFDM signal detection in the WLAN receiver and/or a weak_sig_thr_cck threshold relating to weak CCK signal detection in the WLAN receiver.

A method of adaptively improving interference immunity in a WLAN receiver is also provided. The method can include comparing a first measured false detect rate to a high false detect threshold. If the first measured false detect rate exceeds the high false detect threshold, then a first interference immunity parameter set can be adjusted to provide maximum SSCI immunity. At this point, a second measured false detect rate (measured after adjusting the first interference immunity parameter set) can be compared to a low false detect threshold. If the second measured false detect rate is less than the low false detect threshold, then the first interference immunity parameter set can be adjusted until the false detection rate is close to but below a low threshold. If the second measured false detect rate exceeds the low false detect threshold, then a second interference immunity parameter set can be adjusted based on a type of signal modulation detection available in the WLAN receiver.

If OFDM signal modulation detection is available, then OFDM weak signal detection can be disabled. At this point, a third measured false detect rate (measured after disabling OFDM weak signal detection) can be compared to the low false detect threshold. If the third measured false detect rate is less than the low false detect threshold, then OFDM weak signal detection can be enabled and a threshold relating to weak OFDM signal detection in the WLAN receiver can be increased until the false detection rate is close to but below a low threshold. If OFDM signal modulation detection is not available, then a threshold relating to weak CCK signal detection in the WLAN receiver can be increased.

A fourth measured false detect rate (measured after increasing a threshold relating to weak CCK signal detection) can be compared to the low false detect threshold. If the fourth measured false detect rate is less than the low false detect threshold, then interference immunity can be lowered using the threshold relating to weak CCK signal detection until the false detection rate is close to but below a low threshold. If the fourth measured false detect rate is greater than the low false detect threshold, then all interference immunity parameters can be reset to provide minimum immunity.

If the third measured false detect rate is greater than the low false detect threshold, then the process can determine whether the WLAN receiver is configured to receive OFDM signals. If so, then the threshold relating to weak CCK signal detection can be increased. If not, then all interference immunity parameters can be reset to provide minimum immunity.

A system for mitigating false detects in a WLAN receiver is also provided. The system can include the means for generating a false detect rate value, the means for selecting a set of SSCI immunity parameters based on the false detect rate value, and the means for adjusting a non-SSCI immunity parameter based on the false detect rate value. The SSCI immunity parameters can include a parameter relating to a high power threshold of a signal received by the WLAN receiver as well as a parameter relating to a low power threshold of a signal received by the WLAN receiver. The non-SSCI immunity parameter can include a threshold relating to weak OFDM signal detection in the WLAN receiver and/or a threshold relating to weak CCK signal detection in the WLAN receiver.

An electromagnetic waveform is also provided. The electromagnetic waveform includes a computer program for mitigating false detects in a WLAN receiver. The computer program can further include a first set of instructions for measuring a false detect rate and a second set of instructions for automatically adjusting an interference immunity parameter set in response to the false detect rate.

DETAILED DESCRIPTION OF THE DRAWINGS

Wireless local area networks must work in less than ideal environments, including environments having externally and internally generated interfering RF signals. Interfering signals can cause significant problems with signal detecting, amplifier gain adjustment, and signal decoding.

In accordance with one aspect of the invention, various parameters of the WLAN receiver can be adjusted to mitigate the effects of interference. Specifically, by selectively adjusting sets of these parameters, receiver sensitivity and interference immunity can be advantageously balanced. To facilitate understanding this selective adjustment, an overview of a WLAN receiver is now described.

Figure 2A:
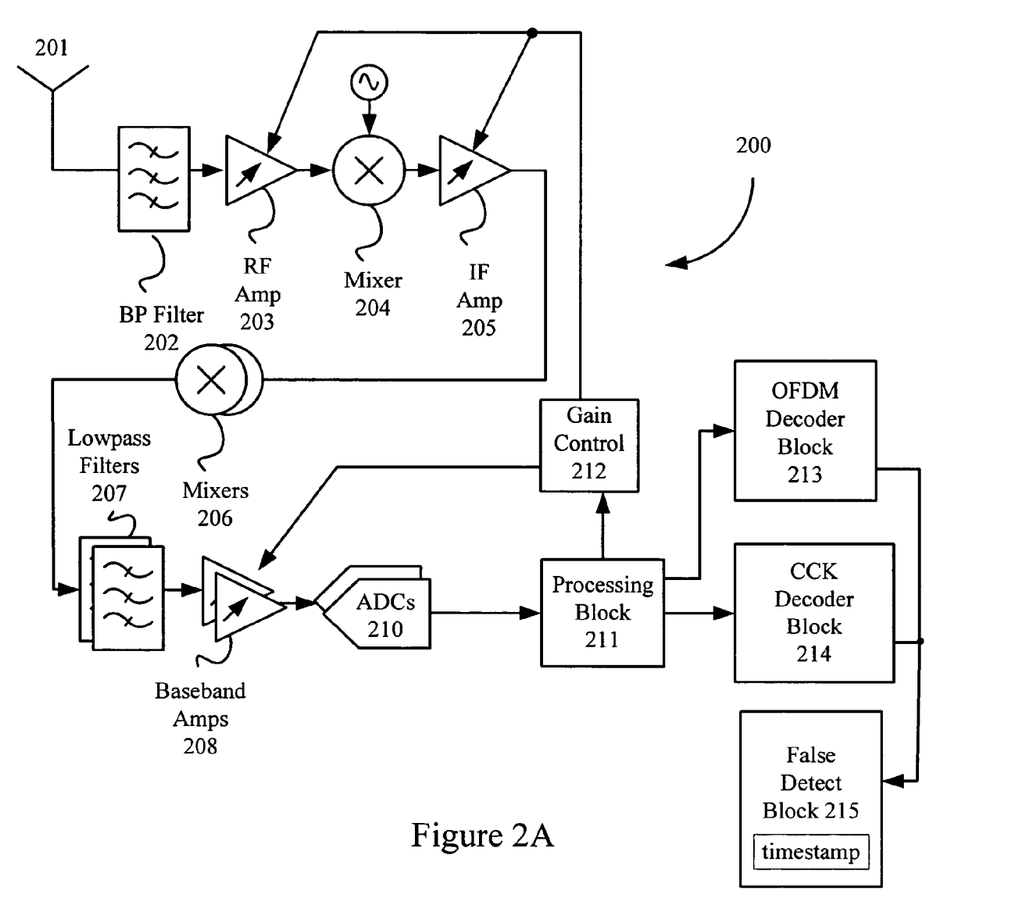
FIGS. 2A and 2B illustrate an exemplary receiver of a WLAN transceiver.

FIG. 2A illustrates a simplified receiver 200 for receiving signals in a WLAN environment. In receiver 200, a bandpass filter 202 receives the incoming signals from an antenna 201 and outputs a predetermined band of frequencies (while excluding those frequencies higher and lower than the predetermined band). A variable RF amplifier 203 can provide an initial amplification to that predetermined band of frequencies. A mixer 204 converts those amplified signals into intermediate frequency (IF) signals, which are then amplified by an IF amplifier 205.

At this point, mixers 206 and low pass filters 207 (including both I and Q branches) can generate signals in the desired channel (called the baseband signals). Amplifiers 208 then amplify these baseband signals. Analog to digital converters (ADCs) 210 (provided for both the I and Q branches of low pass filters 207) transform the amplified baseband signals into digital signals that can be analyzed by a processing block 211. Gain control circuit 212 detects the magnitude of the digital signal, as measured by processing block 211, and uses the detected magnitude to adjust the gains of RF amplifier 203, IF amplifier 205, and BB amplifiers 208.

Processing block 211 determines the modulation type of the detected signal. Note that the 802.11b standard uses a modulation scheme called complementary code keying (CCK), the 802.11a standard uses another modulation scheme called orthogonal frequency division multiplexing (OFDM), and the 802.11g standard can use either the CCK modulation scheme or the OFDM modulation scheme. Processing block 211 provides the modulation type of the detected signal to both an OFDM decoder 213 and a CCK decoder 214 for system optimization, thereby allowing the correct decoder to recover the originally transmitted signal and turning off components not needed to recover the transmitted signal. OFDM decoder 213 and CCK decoder 214 can be implemented using conventional decoders.

Gain control 212 attempts to adjust the gain of amplifiers 203, 205, and 208 so that the size of the received signal at ADCs 210 is neither too small nor too large, either of which can undesirably result in unreliable identification of the signal. In one embodiment, a power measurement block 240 in processing block 211 (described in reference to FIG. 2B) can determine whether the received signal is characterized as weak, strong, or intermediate (i.e. somewhere between the two extremes). Power measurement block 240 can then provide its output to gain control 212 to ensure proper adjustment of the gains of variable amplifiers 203, 205, and 208.

Figure 2B:
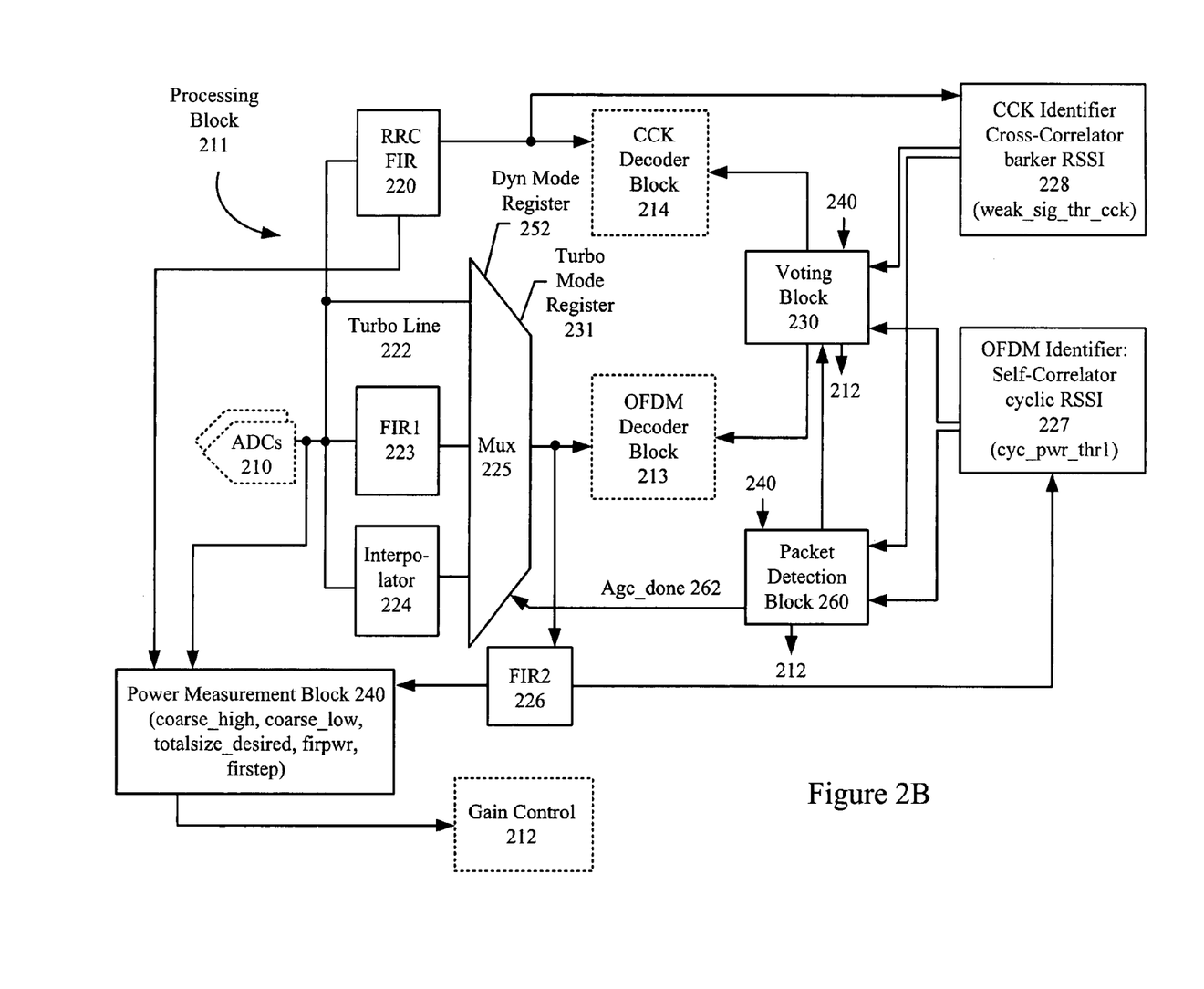

Specifically, a coarse_high threshold and a coarse_low threshold can be set in power measurement block 240, wherein if the average power of a detected signal fails to fall within the two thresholds, then the gain of these variable amplifiers can be adjusted to bring that signal back into the desired range. For example, if the power of a detected signal at ADCs 210, as measured by power measurement block 240, is above the coarse_high threshold, then gain control 212 is triggered to decrease the gain. In contrast, if the detected signal is below the coarse_low threshold, then gain control 212 is triggered to increase the gain.

When the gain is changed (i.e. decreased or increased), power measurement block 240 attempts to get a desired total signal size (totalsize_desired) based on the input range of ADCs 210. Note that to increase interference immunity, coarse_high can be increased (at least some) and both coarse_low and totalsize_desired can be decreased (in one embodiment, significantly more than the increase of coarse_high). This adjustment has the effect of increasing the delta between totalsize_desired and coarse_high while ensuring that totalsize_desired is not less than coarse_low, thereby ensuring that the gain is not changed too often in the receiver. This delta can be helpful because with no interference the signal stays small and a larger interference is needed to exceed coarse_high. After gain adjustments have been made, the search mode is complete and signal identification (also called the demodulation mode) can begin.

FIG. 2B illustrates processing block 211 in greater detail. For context, ADCs 210, gain control 212, CCK decoder block 214, and OFDM decoder block 213 are shown. As shown in FIG. 2B, ADCs 210 can directly provide an output to a power measurement block 240. In this configuration, power measurement block 240 can determine the magnitude of the detected signal as received by processing block 211. Gain control 212 can use this magnitude to provide coarse adjustments to the gains of the variable amplifiers discussed in reference to FIG. 2A.

The variable amplifiers can be set to a relatively high gain to ensure that in the absence of in-band signals even thermal noise of the receive chain can be quantized. Thus, in this case, gain control circuit 212 would typically perform coarse gain adjustments based on strong, not weak, signals. Subsequent fine gain adjustments can be performed based on the output of an RRC FIR filter 220 and a FIR2 filter 226 (described in further detail below) to optimize the signal size. When the optimal signal gain is achieved, an appropriate signal is provided to various components of processing block 211. In one embodiment, the signal can be implemented as an agc_done signal (representing an end to automatic gain control). In processing block 211, packet detection block 260 can generate this agc_done signal.

Because the type of modulation of the packet is initially unknown in the 802.11g mode, processing block 211 allows parallel demodulation of a packet, thereby ensuring the quickest decoding time possible. To provide this parallel demodulation, processing block 211 can provide the output of ADCs 210 to both CCK decoder block 214 and OFDM decoder block 213 via various processing components.

For example, in the case of CCK decoder block 214, RRC FIR filter 220 receives the output of ADCs 210. RRC (root-raised-cosine) FIR filter 220 can be used when the received data rate is identified to be 44 MHz, and the desired data sampling rate is 22 MHz. In other words, RRC filter 220 can be used to provide a down sample of 2 to the output of ADCs 210 as well as to provide matched filter pulse shaping and rejection of out-of-band interference for optimal SNR. After this processing, RRC filter 220 provides the 22 MHz signal to CCK decoder block 214.

In the case of OFDM decoder block 213, a Turbo line 222, a finite impulse response (FIR1) filter 223, and an interpolator 224 all receive the output of ADCs 210 and can provide various levels of OFDM processing to the detected signal. A multiplexer 225, which receives inputs from Turbo line 222, FIR1 filter 223, and interpolator 224, provides its single output to OFDM decoder block 213.

In one embodiment, turbo line 222 can be selected when the data sampling rate received and desired is 80 MHz (i.e. twice as fast as a standard 802.11a signal). In one embodiment, multiplexer 225 selects turbo line 222 only when receiver 200 is in the turbo mode, as determined by a value stored in a turbo mode register 231. In accordance with one feature of the invention, turbo line 222 can have a dual use in receiver 200. Specifically, turbo line 222 can also be selected when the received and desired data sampling rate is 44 MHz. When receiver 200 is in the 802.11g mode, as determined by a value in a dynamic mode register 252, multiplexer 225 selects between turbo line 222 and interpolator 224.

Interpolator 224 can be selected when the received data sampling rate is 44 MHz, and the desired data sampling rate is 40 MHz. Interpolator 224 can be implemented using sequencing interpolator configurations described in U.S. patent application Ser. No. 10/367,527, entitled "RECEIVING AND TRANSMITTING SIGNALS HAVING MULTIPLE MODULATION TYPES USING SEQUENCING INTERPOLATOR", filed on Feb. 14, 2003 by Atheros Communications, Inc., and incorporated by reference herein.

FIR1 filter 223 can be selected when the received data sampling rate is 80 MHz, and the desired data sampling rate is 40 MHz. In other words, FIR1 filter 223 can also be used to provide a down sample of 2 to the output of ADCs 210. This data rate is used for receivers in the 802.11a mode. Thus, in this embodiment, receiver 200 can conform to both 802.11a and 802.11g standards.

In this embodiment of receiver 200, RRC FIR filter 220 and a FIR2 filter 226 (which is coupled to the output of multiplexer 225) provide outputs to power measurement block 240. In this configuration, power measurement block 240 can provide further signal power information to gain control 212, thereby allowing gain control 212 to make additional fine gain adjustments to optimize signal size, if necessary.

FIR2 filter 226 can be used to filter out any nearby blocking signals and reject any out-of-band interference for optimal SNR. FIR2 filter 226 provides its output to an OFDM identifier 227. RRC FIR filter 220 provides its output to a CCK identifier 228.

In general, identifiers 227 and 228 can provide values to a packet detection block 260 during the search mode and to a voting block 230 during the demodulation mode. Specifically, identifiers 227 and 228 can compute normalized power values in the search mode and absolute power modulation-specific RSSI values in the demodulation mode. These values are computed based on certain characteristics, i.e. any number of identifying means including, for example, patterns and/or periodicity of a given signal.

For example, in an OFDM preamble, twelve tones (complex sinusoidals) are spaced (peak to peak) at 1.25 MHz with a period of 0.8 μs. Thus, looking for periodicity of 0.8 μs is very effective in identifying an OFDM signal, even in conditions of low signal to noise ratio (SNR) and heavy multipath. Hence, the term "self-correlation" is appropriate in describing OFDM.

In contrast, in a CCK preamble, Barker signals (an 11-chip spreading code) are multiplied by either −1 or +1. However, the −1/+1 multiplication is applied in a similar manner, thereby establishing a CCK pattern. Hence, the term "cross-correlation" is appropriate in describing CCK.

During a search mode, different detection mechanisms can be used to detect weak and strong signals. Because it is unknown whether the next packet will be strong or weak, these detection mechanisms can operate in parallel. In one embodiment, CCK identifier 228 and OFDM identifier 227 can implement the detection mechanism for a weak signal and provide their outputs to packet detection block 260. In contrast, the detection mechanism for a strong signal can include an indication of a jump in the average power of the received signal (e.g., the average power at the ADCs exceeds coarse_high). In one embodiment, power measurement block 240 can detect this jump and provide that determination to packet detection block 260.

In one embodiment of weak signal detection, a cross-correlation technique for CCK identifier 228 can compare known modulation patterns found in the preamble of a CCK signal with the detected signal. The power of this correlation value can be normalized by the power in the sum of the squares of the samples correlated upon. CCK identifier 228 can provide this normalized value to packet detection block 260, which can then compare this normalized value to a predetermined threshold for CCK modulation weak_sig_thr_cck (e.g. 0.5). If this normalized correlation exceeds weak_sig_thr_cck, then one or more fine gain adjustments can be performed on the variable amplifiers based on outputs from packet detection block 260 and power measurement block 240 to gain control 212.

A substantially similar procedure could be performed using a self-correlation technique for OFDM identifier 227. In this case, each sample can be multiplied by the conjugate of a sample a fixed number of samples ago and summed for a fixed amount of time. The average power of this value, cyc_rssi, can be compared to another predetermined threshold for OFDM modulation, cyc_pwr_thr1 (e.g. 1 dB). If cyc_rssi is less than cyc_pwr_thr1 (e.g. 1 dB), then the packet is ignored. In contrast, if the cyc_rssi exceeds cyc_pwr_thr1, then one or more fine gain adjustments can be performed on the variable amplifiers based on outputs from packet detection block 260 to gain control 212.

After the first of identifiers 227 and 228 exceeds its threshold value in weak signal detection, packet detection block 260 notes the identified modulation type and stops the search mode. In one embodiment, voting block 230 determines the type of modulation from identifiers 227/228 during the search mode and provides this identification to packet detection block 260. In this manner, identification of the most probable modulation type for a weak signal can occur immediately after the agc_done signal is asserted. This identification process, performed by voting block 230, is described in U.S. Patent application Ser. No. 10/698666, entitled "Voting Block For Identifying WLAN Signal Modulation Type", filed on Oct. 31, 2003 by Atheros Communications, Inc., and incorporated herein by reference.

Notably, an interference signal can undesirably generate a packet processing error. For example, spread spectrum clock interference (SSCI) can generate an error each time its swept clock artifact enters the receiver passband. If a legitimate packet is already being processed, then an error may issue while processing that legitimate packet depending on the modulation type as well as the relative size of the interference and the packet. Even if a packet is not being processed, then the detected change of power may erroneously trigger signal detection and demodulation. Once identified as interference, rather than a legitimate packet, the appropriate decoder block will issue a packet processing error to false detect block 215 (FIG. 2A).

A narrowband interference signal, e.g. a spur, may trigger the weak signal detection mechanism of OFDM identifier 227 if the interfering signal is an approximate multiple of 1.25 MHz offset from the carrier, but within the received bandwidth. Thus, spur interference can also erroneously trigger signal detection and demodulation, which in turn will result in packet processing errors.

Figure 3A:
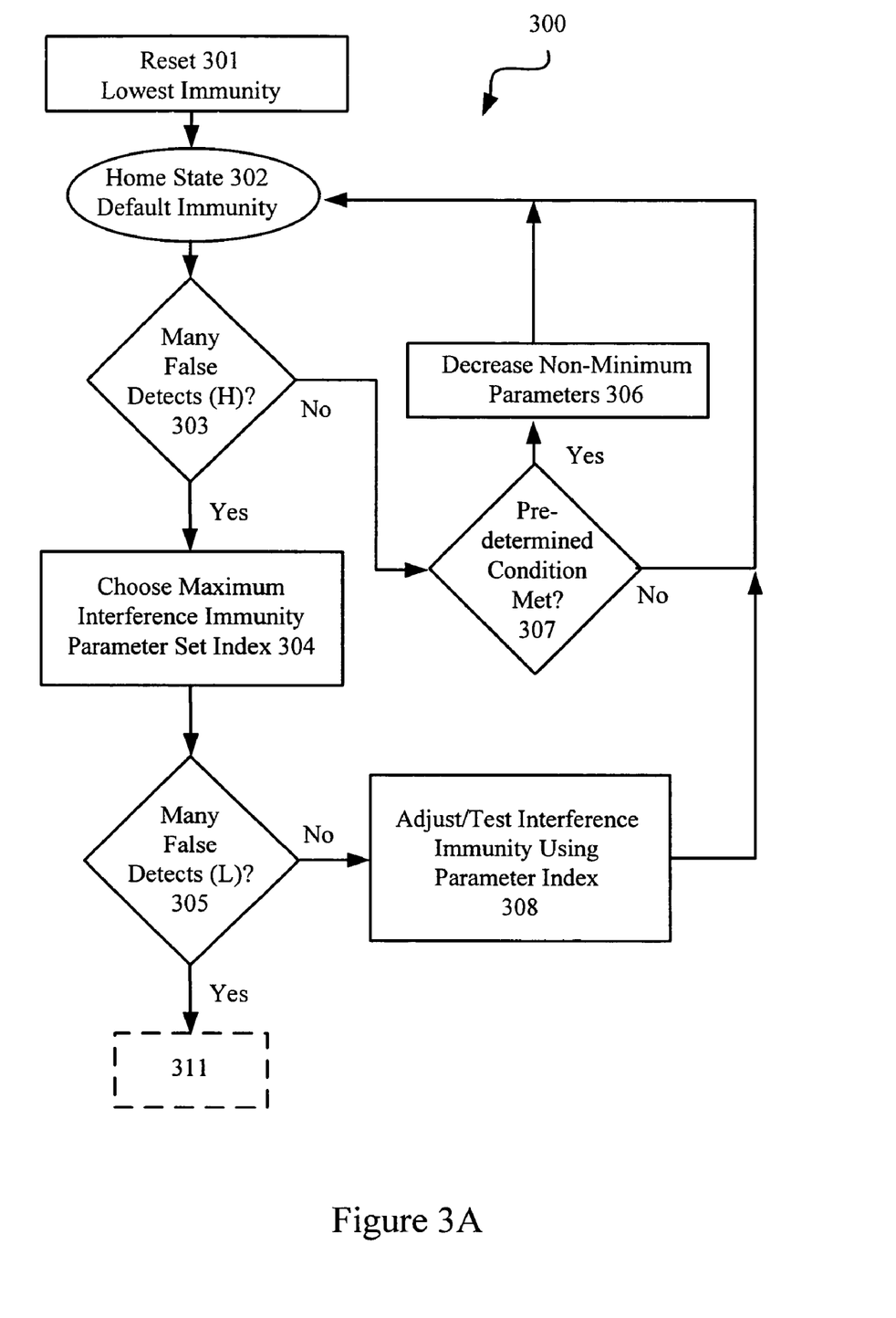
FIGS. 3A and 3B illustrate a process flow that can provide interference mitigation caused by spread spectrum clocks, spurs, Barker-coded packets, and similar signals.
Figure 3B:
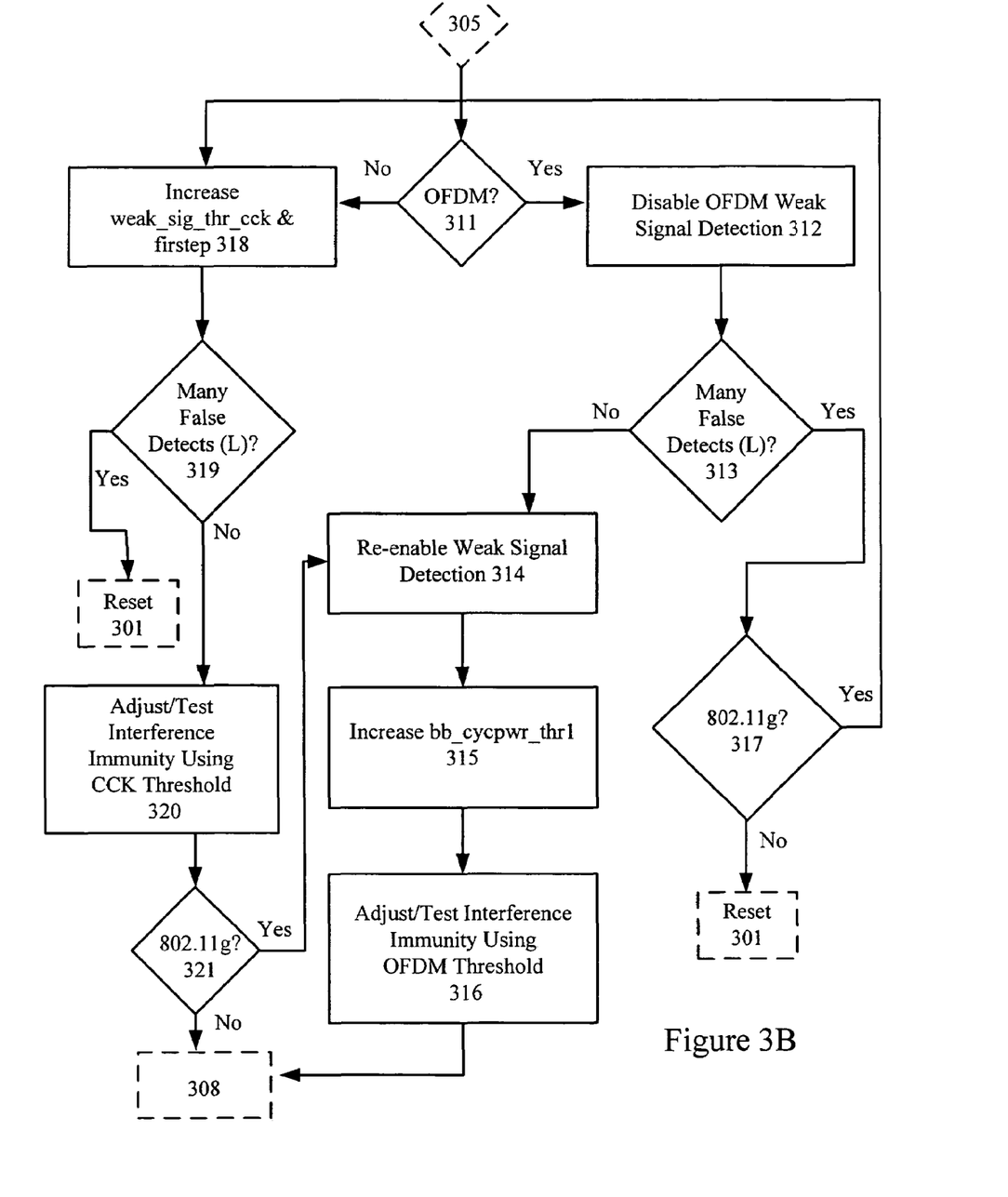

FIGS. 3A and 3B illustrate a flowchart of an exemplary false detect mitigation technique 300. In this technique, both SSCI mitigation steps and spur/Barker (generically referenced as non-SSCI) mitigation steps can be performed. The ordering of these steps can be based on the probability of minimizing false detects. For example, SSCI mitigation steps could be performed before spur/Barker mitigation steps where empirical evidence indicates that SSCI mitigation steps have a higher probability of minimizing false detects compared to spur/Barker mitigation steps. Other embodiments of false detect mitigation techniques could provide a different ordering or select only one set of the mitigation steps.

In step 301, the interference immunity parameters can be set to provide lowest immunity to interfering signals. Note that the lower the immunity, the higher the sensitivity of the receiver. Therefore, step 301 also has the effect of maximizing sensitivity of the receiver. Home state 302 retains the values of the interference immunity parameters (called default immunity). Thus, at least initially, default immunity in home state 302 is equivalent to the lowest immunity.

A typical WLAN environment, such as WLAN environment 100 shown in FIG. 1, could have many interfering signals. Setting the receiver to lowest immunity could result in many false detects, which would undesirably affect receiver performance. Therefore, as explained below, these parameters can be adjusted based on a measured rate of false detects or meeting predetermined conditions.

For example, step 303 can determine the results of a "many false detects" test. This test compares a false detect rate against a threshold value. In one embodiment, the false detect rate can be calculated in false detect block 215 (FIG. 2A) by counting a predefined number of false detect errors and measuring the timestamp difference between the first and last counted false detect errors in the counted group of false detect errors. This method has the advantage of quickly detecting a high false detect rate. In other embodiments, a count of false detect errors may be made for a predefined period of time.

False detect mitigation technique 300 can include a "many false detects" test with a high (H) threshold (e.g. 2,500/sec) and another "many false detects" test with a low (L) threshold (e.g. 1,000/sec). In one embodiment, step 303 performs a "many false detects" test with a high (H) threshold, whereas subsequent "many false detects" tests have a low (L) threshold. Thus, step 303 reflects a reluctance to change interference immunity parameters, particularly when the receiver is at high sensitivity.

If "many false detects" are not detected in step 303, then perhaps the parameters of the interference immunity parameter set can be adjusted for even higher receiver sensitivity.

In one embodiment, step 307 determines whether a predetermined condition is met for that adjustment. In one embodiment, the predetermined condition could relate to whether the process has passed through this step for an Nth time. In other embodiments, the predetermined condition could relate to whether a predetermined period of time has expired. If the predetermined condition is not met, then the process returns to home state 302.

If the predetermined condition is met, then one or more interference immunity parameters that are not at their minimum values can be adjusted toward their minimum values in step 306. A "minimum value" refers to a value that has a lesser effect on interference immunity, thereby increasing receiver sensitivity. In one embodiment, all interference immunity parameters can be minimized. In another embodiment, step 306 can affect a group of parameters. For example, for times T through steps 307 and 306, parameters affecting SSCI mitigation could be reduced for T=1 and parameters affecting spur/Barker mitigation could be reduced for T=2. After adjusting the appropriate parameters in step 306, the process can return to home state 302. The loops formed by steps 302, 303, 307, and 306 can advantageously minimize the need to adjust the interference immunity parameter set based on transient interference events while ensuring that the receiver sensitivity is continuously improved.

If "many false detects" (H) are detected in step 303, then SSCI mitigation can be initiated. Specifically, in step 304, an index associated with a specific interference immunity parameter set can be chosen. In one embodiment, the SSCI interference immunity parameters can be organized in a table format. Indexes to the table can refer to sets of specific, empirically determined values for the interference immunity parameters. This table can be stored in memory of the WLAN device and accessed during SSCI mitigation. Table 1 illustrates exemplary SSCI interference immunity parameter sets.

TABLE 1

Exemplary SSCI Interference Immunity Parameters

| index | measured immunity (dB) | totalsize_desired (half dB) | coarse_high (half dB) | coarse_low (half dB) | firpwr (half dB) |
|---|---|---|---|---|---|
| 4 | 27 | −62 | −12 | −70 | −80 |
| 3 | 23 | −55 | −14 | −64 | −78 |
| 2 | 18 | −48 | −16 | −60 | −75 |
| 1 | 16 | −41 | −18 | −56 | −72 |
| 0 | 14 | −34 | −18 | −52 | −70 |

In this embodiment, Table 1 includes four interference immunity parameter set entries and associated indexes, wherein index=0 represents parameter values for a WLAN device operating with least interference immunity (and maximum receiver sensitivity). Although Table 1 includes four entries, other tables could include more or less entries having the same or different values in a set.

Note that actual table implementations would typically not include values for the measured immunity (which are provided herein for illustration purposes). Further note that firpwr is not part of interference immunity per se, but should change based on the values for coarse_low and totalsize_desired. Firpwr is a check that ensures an absolute size of the inband signal at ADCs 210 (FIG. 2A) using strong signal detection. That is, firpwr minimizes false triggering on an adjacent out-of-band signal. If the size of the signal is less than the desired firpwr, then real packets may not be detected. The firpwr check can be performed immediately after the signal is determined to be between course_high and coarse_low after a coarse gain drop. In this embodiment of Table 1, the parameter values coarse_high, coarse_low, totalsize_desired and firpwr are expressed as ½ dB increments (in this embodiment, an integer step in a control register is set to a desired precision such that changes can be measured in ½ dB).

In one embodiment, step 304 can choose index 4, i.e. the set of SSCI interference immunity parameters that can provide the maximum interference immunity (and minimum receiver sensitivity). Using the chosen interference immunity parameter set, step 305 can then perform a "many false detects" (L) test. If many false detects (low threshold) are not detected, then the interference immunity can be adjusted in step 308. To implement step 308 using Table 1, the chosen index can first be decreased (e.g. from 4 to 3). Then, the effect of this index can be tested by determining whether many false detects (low threshold) are detected (e.g. step 305). This parameter adjustment/testing can be repeated, i.e. sensitivity of the receiver is increased by decreasing interference immunity, until the low threshold of many false detects is met or exceeded. At this point, the last adjustment can be undone, thereby providing the maximum possible interference immunity with an acceptable number of false detects.

If many false detects (L) are detected in step 305, thereby indicating that SSCI is not a significant source of or perhaps not the sole source of interference, then the process proceeds to step 311 (FIG. 3B), which initiates a spur/Barker code mitigation. Step 311 determines whether the receiver is configured to receive OFDM signals (recall that the receiver may include OFDM and/or CCK identifiers, shown in FIG. 2B, to detect weak signals (and assist in identifying the modulation type)).

If the receiver is configured to receive OFDM signals, as determined by step 311, then step 312 disables OFDM weak signal detection. In one embodiment, disabling OFDM weak signal detection is performed by setting a number of parameters so as to render OFDM weak signal detection impossible rather than by physically disabling the weak signal detection circuitry (i.e. OFDM identifier 227). Table 2 indicates exemplary values for such parameters. Note that bb_m1thres and bb_m2thres refer to normalized, self-correlated thresholds, bb_m2count_thr refers to the number of self-correlation values (wherein a typical count would not exceed 31), and bb_use_self_corr_low refers to an enabling bit value.

TABLE 2

Parameters To Disable OFDM Weak Signal Detection

| Parameter | Value |
|---|---|
| bb_m1thres | 127 |
| bb_m2thres | 127 |
| bb_m2count_thr | 31 |
| bb_use_self_corr_low | 0 |

After disabling weak signal detection, step 313 can then perform a "many false detects" (L) test. If many false detects (low threshold) are detected, thereby indicating that step 312 was ineffective, then step 317 determines whether 802.11g is being used. In other words, the continuing interference could be from Barker data being detected as preambles resulting from reception of a nearby IEEE-802.11b WLAN using the 1 Mb/s mode or the 2 Mb/s mode (i.e. after any collisions of 1 and 2 Mbps packets, the data can appear to be a Barker header). Step 318 can advantageously address this issue. Therefore, if the receiver is configured to receive CCK signals, then the process proceeds to step 318 to adjust weak_sig_thr_cck and firstep. If the receiver is not configured to receive CCK signals, as determined by implication in step 317, then the process proceeds to reset step 301, described above.

If many false detects are not detected in step 313, thereby indicating that disabling of OFDM weak signal detection successfully mitigated the interference, then step 314 re-enables weak signal detection. In step 315, the threshold bb_cycpwr_thr1 can be increased by 1 dB, thereby lowering interference immunity.

Increasing the value of threshold bb_cycpwr_thr1, in effect, raises the threshold for identifying an OFDM packet (e.g. for OFDM identifier 227 (see FIG. 2B)). In other words, although weak signal detection has been identified as the source of the interference, weak signal detection is still needed to identify weak OFDM signals. Therefore, the threshold bb_cycpwr_thr1 can be increased, thereby allowing the detection of larger weak OFDM signals while minimizing false detects.

Then, the effect of this adjustment can be tested in step 316 by determining whether many false detects (low threshold) are detected (e.g. step 313). This threshold adjustment/testing can be repeated, i.e. sensitivity of the receiver is increased by decreasing interference immunity, until the low threshold of many false detects is met or exceeded. At this point, the last adjustment can be undone, thereby providing the maximum possible interference immunity with an acceptable number of false detects. At this point, the process can return to step 308.

If the receiver is not configured to receive OFDM signals, then step 318 increases the value of thresholds weak_sig_thr_cck and firstep. In other words, step 318 assumes that some signal that looks like a CCK signal, but is not, is present. Therefore, to filter out this interfering signal, the value of threshold weak_sig_thr_cck (i.e. the threshold used by CCK identifier 228 (see FIG. 2b)) can be increased from 6 to 8, thereby in effect raising the threshold for identifying a CCK packet.

To detect a weak signal using correlation, some increase in in-band power must have been detected. This increase in power, i.e. a power delta, can then be compared to a threshold value firstep. If the power delta is equal to or greater than firstep, then a weak signal is detected. Thus, step 318 also raises the threshold for detecting any weak signal.

After increasing these thresholds, step 319 then performs a "many false detects" (L) test. If many false detects (low threshold) are detected, thereby indicating that false detects mitigation has not succeeded, then the process returns to reset step 301. In some embodiments, a return to this step may cause an exception to be raised to driver software, thereby triggering a channel shift. If many false detects (low threshold) are not detected, then mitigation efforts were successful and the process proceeds to step 320. In step 320, the threshold weak_sig_thr_cck can be decreased by 1 dB, thereby lowering interference immunity. Then, the effect of this decrease can be tested by determining whether many false detects (low threshold) are detected (e.g. step 319). This parameter adjustment/testing can be repeated, i.e. sensitivity of the receiver is increased by decreasing interference immunity, until the low threshold of many false detects is met or exceeded. At this point, the last adjustment can be undone, thereby providing the maximum possible interference immunity with an acceptable number of false detects.

Step 321 determines whether 802.11g is being used. Note that pursuant to step 312, the WLAN receiver could have been disabled from using OFDM weak signal detection. If many false detects (low threshold) are still present and 802.11g is being used, as subsequently determined in step 317, then the process proceeds to step 318. Step 321 advantageously allows OFDM weak signal to be re-enabled by returning to step 314. In one embodiment, adjustment of the OFDM threshold can be performed in steps 315 and 316 to further optimize receiver sensitivity and interference immunity. Then, the process can return to step 308. Note that if step 321 determines that 802.11g is not being used, thereby indicating that the WLAN received is configured to only receive CCK signals, then the process can immediately proceed to step 308.

Returning to step 308 allows adjustment and testing of interference immunity using the parameter index. Note that pursuant to step 304 the maximum interference immunity parameter set was chosen. Thus, performing step 308 after either step 316 or step 321 advantageously allows receiver sensitivity and interference immunity to be further optimized.

Although illustrative embodiments have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, the false detect techniques described herein can be implemented in numerous ways, e.g. a process, an apparatus, a system, a computer readable medium such as a computer readable storage medium, or a computer network wherein software program instructions are sent over optical or electronic communication links. In one embodiment of a WLAN receiver, the CCK identifier can further include a barker threshold, e.g. barker_rssi_thr1, for detection of Barker-encoded signals. In another embodiment, when determining the results of the "many false detects" test, a normalized rate can be used based on transmit activity. This normalized rate takes into account the time for transmitting or actively receiving a packet. For example, the normalized time can be equal to summing the transmit time and the receive time and subtracting this sum from the total time.

Accordingly, it is intended that the scope of the invention be defined by the following claims and their equivalents.

The invention claimed is:

1. A method of adaptively improving interference immunity, the method comprising:
    measuring a false detect rate, wherein a false detect erroneously characterizes an interfering signal as a valid data packet; and
    automatically adjusting an interference immunity parameter set in response to the false detect rate, wherein automatically adjusting includes accessing the interference immunity parameter set corresponding to an index of a table of interference immunity parameter sets.

2. The method of claim 1 wherein measuring comprises:
    time-stamping a plurality of false detect events including at least a first false detect event and a last false detect event;
    counting a fixed number of the plurality of false detect events; and calculating a ratio of the fixed number and the difference between the last false detect event time stamp and the first false detect event time stamp.

3. The method of claim 1 wherein automatically adjusting comprises:
selecting an interference immunity parameter based on an interference type.

4. The method of claim 1 wherein automatically adjusting comprises:
measuring the efficacy of the adjusted interference immunity parameter set.

5. The method of claim 1 further including generating the table of interference immunity parameter sets.

6. The method of claim 1 wherein automatically adjusting includes periodically reducing non-minimum values in at least one interference immunity parameter set.

7. The method of claim 1 wherein automatically adjusting includes periodically reducing an interference immunity parameter based on the type of interference.

8. The method of claim 1 wherein measuring and automatically adjusting are repeated for each type of interference.

9. A method of adaptively improving interference immunity, the method comprising:
measuring a false detect rate, wherein a false detect erroneously characterizes an interfering signal as a valid data packet; and
automatically adjusting an interference immunity parameter set in response to the false detect rate,
wherein measuring comprises:
time-stamping a plurality of false detect events including at least a first false detect event and a last false detect event;
counting a fixed number of the plurality of false detect events; and
calculating a ratio of the fixed number and the difference between the last false detect event time stamp and the first false detect event time stamp, less an amount equal to the sum of an active transmit time and an active receive time.

10. An adaptive interference reducer in a WLAN receiver, the adaptive interference reducer comprising:
a false detect block for generating a false detect rate value, wherein a false detect erroneously characterizes an interfering signal as a valid data packet;
a power measurement block for selecting a set of spread spectrum clock interference (SSCI) immunity parameters based on the false detect rate value; and
a modulation identifier for adjusting an immunity parameter other than SSCI based on the false detect rate value.

11. The adaptive interference reducer of claim 10 wherein the SSCI immunity parameters include:
a coarse_high parameter relating to a high power threshold of a signal to the WLAN receiver; and
a coarse_low parameter relating to a low power threshold of a signal to the WLAN receiver.

12. The adaptive interference reducer of claim 10 wherein the immunity parameter other than SSCI includes: a bb_cy-cpwr_thr1 threshold relating to weak OFDM signal detection in the WLAN receiver.

13. The adaptive interference reducer of claim 10 wherein the immunity parameter other than SSCI includes:
a weak_sig_thr_cck threshold relating to weak CCK signal detection in the WLAN receiver.

14. The adaptive interference reducer of claim 10 wherein the false detect block generates a first false detect event time stamp and a last false detect event time stamp to calculate the false detect rate value.

15. The adaptive interference reducer of claim 10 wherein the SSCI immunity parameters are provided in an indexed table.

16. A method of adaptively improving interference immunity in a WLAN receiver, the method comprising:
comparing a first measured false detect rate to a high false detect threshold, wherein a false detect erroneously characterizes an interfering signal as a valid data packet;
if the first measured false detect rate exceeds the high false detect threshold, then adjusting a first interference immunity parameter set to provide maximum spread spectrum clock interference (SSCI) immunity;
comparing a second measured false detect rate, which is measured after adjusting the first interference immunity parameter set, to a low false detect threshold;
if the second measured false detect rate is less than the low false detect threshold, then adjusting the first interference immunity parameter set until a predetermined number of false detects disappear; and
if the second measured false detect rate exceeds the low false detect threshold, then adjusting a second interference immunity parameter set based on a type of signal modulation detection available in the WLAN receiver.

17. The method of claim 16 wherein if OFDM signal modulation detection is available, then
disabling OFDM weak signal detection;
comparing a third measured false detect rate, which is measured after disabling OFDM weak signal detection, to the low false detect threshold; and
if the third measured false detect rate is less than the low false detect threshold, then enabling OFDM weak signal detection and increasing a threshold relating to weak OFDM signal detection in the WLAN receiver until a predetermined number of false detects disappear.

18. The method of claim 17 wherein if OFDM signal modulation detection is not available, then
increasing a threshold relating to weak CCK signal detection in the WLAN receiver.

19. The method of claim 18 further including:
comparing a fourth measured false detect rate, which is measured after increasing a threshold relating to weak CCK signal detection, to the low false detect threshold;
if the fourth measured false detect rate is less than the low false detect threshold, then lowering interference immunity using the threshold relating to weak CCK signal detection until a predetermined number of false detects disappear; and
if the fourth measured false detect rate is greater than the low false detect threshold, then resetting all interference immunity parameters to provide minimum immunity.

20. The method of claim 17 wherein if the third measured false detect rate is greater than the low false detect threshold, then determining whether the WLAN receiver is configured to receive 802.11g signals,
if so, then proceeding to increasing the threshold relating to weak CCK signal detection, and
if not, then proceeding to resetting all interference immunity parameters to provide minimum immunity.

21. A system for mitigating false detects in a WLAN receiver, the system comprising:

means for generating a false detect rate value, wherein a false detect erroneously characterizes an interfering signal as a valid data packet;

means for selecting a set of spread spectrum clock interference (SSCI) parameters based on the false detect rate value; and means for adjusting a non-SSCI immunity parameter based on the false detect rate value.

22. The system of claim 21 wherein the SSCI immunity parameters include:
   a parameter relating to a high power threshold of a signal received by the WLAN receiver; and
   a parameter relating to a low power threshold of a signal received by the WLAN receiver.

23. The system of claim 21 wherein the non-SSCI immunity parameter includes:
   a threshold relating to weak OFDM signal detection in the WLAN receiver.

24. The system of claim 21 wherein the non-SSCI immunity parameter includes:
   a threshold relating to weak CCK signal detection in the WLAN receiver.

25. The system of claim 21 wherein the means for generating determines a first time of a first false detect and a second time of another false detect and uses the first and second times to determine the false detect rate value.

26. A computer readable medium comprising computer instructions that, when run on a computer, generate signals to mitigate false detects in a WLAN receiver, the computer instructions comprising:
   a first set of instructions for measuring a false detect rate, wherein a false detect erroneously characterizes an interfering signal as a valid data packet; and
   a second set of instructions for automatically adjusting an interference immunity parameter set in response to the false detect rate, wherein the second set of instructions includes instructions for accessing the interference immunity parameter set corresponding to an index of a table of interference immunity parameter sets.

27. The computer readable medium of claim 26 wherein the first set of instructions for measuring includes:
   instructions for time-stamping a plurality of false detect events including at least a first false detect event and a last false detect event;
   instructions for counting a fixed number of the plurality of false detect events; and
   instructions for calculating a ratio of the fixed number and the difference between the last false detect event time stamp and the first false detect event time stamp.

28. The computer readable medium of claim 26 wherein the second set of instructions for automatically adjusting includes:
   instructions for selecting an interference immunity parameter based on an interference type.

29. The computer readable medium of claim 26 wherein the second set of instructions for automatically adjusting includes:
   instructions for measuring the efficacy of the adjusted interference immunity parameter set.

30. The computer readable medium of claim 26 further including a third set of instructions for generating the table of interference immunity parameter sets.

31. The computer readable medium of claim 26 wherein the second set of instructions for automatically adjusting includes instructions for periodically reducing non-minimum values in at least one interference immunity parameter set.

32. The computer readable medium of claim 26 wherein the second set of instructions for automatically adjusting includes instructions for periodically reducing an interference immunity parameter based on the type of interference.

33. The computer readable medium of claim 26 further including a third set of instructions for repeating the first set of instructions for measuring and the second set of instructions for automatically adjusting for each type of interference.

* * * * *